(12) United States Patent
Nanba

(10) Patent No.: US 6,714,474 B2
(45) Date of Patent: Mar. 30, 2004

(54) METHOD OF CHECKING THE STATE OF A CAPACITOR FUSE IN WHICH THE VOLTAGE APPLIED TO THE CAPACITOR FUSE IS THE SAME LEVEL AS VOLTAGE APPLIED TO MEMORY CELLS

(75) Inventor: Yasuhiro Nanba, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/410,124

(22) Filed: Apr. 9, 2003

(65) Prior Publication Data

US 2003/0198107 A1 Oct. 23, 2003

(30) Foreign Application Priority Data

Apr. 16, 2002 (JP) ........................................ 2002-113322

(51) Int. Cl.[7] .................................................. G11C 7/00
(52) U.S. Cl. ................ 365/226; 365/225.7; 365/189.05
(58) Field of Search ............................. 365/226, 225.7, 365/189.05

(56) References Cited

U.S. PATENT DOCUMENTS 6,256,237 B1 * 7/2001 Ho et al. ................. 365/225.7
6,333,877 B1 * 12/2001 Nagaoka et al. ............ 365/226
6,542,419 B2 * 4/2003 Hasegawa .............. 365/189.05

FOREIGN PATENT DOCUMENTS

| JP | 2000-082297 | 3/2000 |
| JP | 2000-090689 | 3/2000 |
| JP | 2002-042472 | 2/2002 |
| WO | WO 98/15958 | 4/1998 |

* cited by examiner

*Primary Examiner*—Huan Hoang
(74) *Attorney, Agent, or Firm*—Katten Muchin Zavis Roseman

(57) ABSTRACT

A method is disclosed for checking the state of a capacitor fuse in which the voltage that is applied to the capacitor fuse is made the same level as voltage that is applied to memory cells. When detecting the occurrence of cutting of a capacitor fuse, voltage HVCCF (0.7 V), which is a voltage that is half the voltage of the power supply VINTS (1.4 V) for driving a sense amplifier, is used to charge the capacitor fuse, and the difference in potential between the voltage that has accumulated in the capacitor fuse and a voltage (0.5 V) that is lower than HVCCF is amplified by a sense amplifier and then latched by a latch circuit unit. Voltage HVCCF (0.7 V) that is applied across the two electrodes of the capacitor fuse is a voltage of the same level as the voltage that is applied to normal memory cells, and the reliability of the semiconductor memory device is therefore improved.

14 Claims, 6 Drawing Sheets

METHOD OF CHECKING THE STATE OF A CAPACITOR FUSE IN WHICH THE VOLTAGE APPLIED TO THE CAPACITOR FUSE IS THE SAME LEVEL AS VOLTAGE APPLIED TO MEMORY CELLS

BACKGROUND OF THE INVENTION

1. Field of the Invention

The present invention relates to a semiconductor memory device such as Synchronous Dynamic Random Access Memory (SDRAM), and more particularly to a semiconductor memory device that is provided with capacitor fuses and to a method of checking the state of the capacitor fuses.

2. Description of the Related Art

Increases in the speeds of CPUs in recent years have been accompanied by demand for DRAM that can perform faster data reading and writing. SDRAM, which achieves higher operating speeds by operating in synchronization with clock signals from the outside, has come to be widely used as a means of achieving these higher data transfer speeds. SDRAM includes both SDR (Single Data Rate)-SDRAM, in which data are transferred only at the rising edge or the falling edge of a clock signal, and DDR (Double Data Rate)-SDRAM, in which a higher data transfer speed is achieved by transferring data at both the rising and falling edges of a clock signal. A DDR-II mode, which is a mode for higher-speed applications of DDR, is currently being investigated for achieving still higher speeds.

In this type of semiconductor memory device, fuse elements are used for operations such as storing the addresses of redundant memory cells and setting the parameters in initial micro-adjustment circuits. These fuse elements include types that normally function as resistor elements but that blow out and enter an insulating state when an overcurrent flows, and types that are cut by irradiation of a laser beam.

However, a certain amount of surface area is required to form resistor elements, and when this type of resistor element is used as a fuse element, there is the problem that an increase in the number of fuse elements results in a corresponding increase in the layout area. Capacitor fuses are therefore used to realize the fuse elements in limited areas. A capacitor fuse is an element in which the application of high voltage between two electrodes that are normally in an insulated state causes the destruction of a dielectric film, the resulting dielectric breakdown placing the two electrodes in a connected state. The use of this type of capacitor fuse allows one fuse element to be realized in the same layout area as one memory cell.

In contrast to a normal fuse element, which functions as a resistance element before being cut and then enters an open state after being cut, a capacitor fuse functions as a capacitor that is in an open state across the two electrodes before being cut and then functions as a resistor element after being cut.

In a semiconductor memory device that uses this type of capacitor fuse, the capacitor fuse must be checked for cutting when the power supply of the entire semiconductor memory device is turned on, the detection results being latched and taken as a determination result.

As one common method of checking the state of a capacitor fuse for detecting whether the capacitor fuse has been cut or not, a particular voltage is applied to the capacitor fuse, and then, after halting the application of this voltage, the voltage across the two ends of the capacitor fuse is measured. This method detects cutting of the capacitor fuse by taking advantage of the fact that the element will function as a capacitor and thus store the applied voltage if the capacitor fuse has not been cut, but will not store the applied voltage if the capacitor fuse has been cut.

This type of capacitor fuse is produced in the same fabrication step as memory cells and therefore has the same characteristics as memory cells. Normally, a voltage of 1.4 V is applied to one end of a memory cell while a voltage of 0.7 V is applied to the other end, whereby a voltage of only 0.7 V is applied across the two ends. In contrast, when detecting whether a capacitor fuse has been cut or not, a voltage of 1.4 V is applied to one electrode of the capacitor fuse while the other electrode remains at the ground (GND) voltage, and a voltage of 1.4 V is therefore applied across the two electrodes. In addition, this voltage of 1.4 V is applied to the capacitor fuse each time the power supply is supplied to the semiconductor memory device.

The voltage (super voltage: SVT) that is applied when cutting a capacitor fuse is normally 6–7 V, and the breakdown voltage of the capacitor fuse is therefore generally not set as high. Thus, increasing the applied voltage from 0.7 V to 1.4 V results in an exponential shortening of the life expectancy of the element. In other words, since the capacitor fuse is provided with the same characteristics as memory cells as previously explained, the application of a voltage to a capacitor fuse that is approximately twice the voltage that is applied to memory cells accelerates deterioration, and in a worst case, brings about the breakdown of the capacitor fuse. The breakdown of the capacitor fuse and the resulting conductive state of the capacitor fuse results in the problem of malfunctioning such as the alteration of the set specifications or difficulty in substituting defective memory cells with redundant memory cells.

However, if the voltage that is applied across the two electrodes of the capacitor fuse is simply made a voltage of 0.7 V, similar to the voltage in the memory cells, the occurrence of cutting in the capacitor fuse can no longer be detected.

As an example, an inverter of typical construction such as shown in FIG. 1 is used in a latch circuit unit for latching a determination signal based on the voltage that is stored in a capacitor fuse. This inverter is constructed from p-channel MOS transistor 81 and n-channel MOS transistor 82 and operates by inverting the logic of the voltage that is received as input from input terminal 80 and supplying the result as output from output terminal 83.

When a high-level voltage is received as input from input terminal 80 in this inverter, n-channel MOS transistor 82 turns on and p-channel MOS transistor 81 turns OFF, whereby the output terminal becomes low level, i.e., the GND potential. On the other hand, when a low-level voltage is received as input from input terminal 80, n-channel MOS transistor 82 turns OFF and p-channel MOS transistor 81 turns on, whereby high-level voltage VPERI is supplied to output terminal 83.

The operation of the inverter shown in FIG. 1 is next explained for a case in which voltage VPERI is 1.8 V and the high-level voltage that is received from input terminal 80 is 0.7 V.

When a voltage of 0.7 V is applied to input terminal 80, the voltage across the gate and source of n-channel MOS transistor 82 equals or exceeds the threshold value and the transistor turns on. However, the voltage across the source and gate of p-channel MOS transistor 81 is 1.1 V, and p-channel MOS transistor 81 therefore does not turn OFF.

Essentially, p-channel MOS transistor 81 and n-channel MOS transistor 82 both turn on at the same time and the inversion operation is not performed correctly.

Accordingly, when detecting for the occurrence of cutting of a capacitor fuse, the voltage that is applied across the two ends of the capacitor fuse cannot be simply made 0.7 V, i.e., the voltage that is applied in memory cells. As a result, the voltage that is applied to a capacitor fuse when checking for the occurrence of cutting of the capacitor fuse is higher than the voltage that is applied to memory cells, and this higher voltage raises the problem of compromised reliability.

SUMMARY OF THE INVENTION

It is an object of the present invention to provide a semiconductor memory device in which the voltage that is applied to a capacitor fuse when checking for the occurrence of cutting in the capacitor fuse is made the same level as the voltage that is applied to memory cells, whereby an improvement in reliability can be obtained.

To achieve the above-described object, the semiconductor memory device of the present invention is provided with a power supply generation circuit unit and a capacitor fuse circuit unit.

The power supply generation circuit unit generates a first voltage and a second voltage that is lower than the first voltage. The capacitor fuse circuit unit is composed of a capacitor fuse, a circuit for charging the capacitor fuse with the first voltage, a sense amplifier for amplifying the difference in potential between the voltage that has accumulated in the capacitor fuse and the second voltage, and a latch circuit unit for latching the voltage level that has been amplified by the sense amplifier and supplying the result as a determination signal.

According to the present invention, when checking for the occurrence of cutting of a capacitor fuse, the capacitor fuse is charged with the first voltage, the difference in potential between the voltage that has accumulated in the capacitor fuse and the second voltage is amplified by the sense amplifier, and this amplified potential difference is then latched by the latch circuit unit and supplied as a determination signal. When the capacitor fuse has not been cut, the difference in potential between the first voltage and the second voltage is amplified by the sense amplifier, and when the capacitor fuse has been cut, the difference in potential between a voltage of substantially ground potential and the second voltage is amplified by the sense amplifier. As a result, a normal latch operation can be carried out in the latch circuit unit even when the first voltage is made a low voltage of the same level as the voltage that is normally applied to memory cells. The life expectancy of the capacitor fuse can therefore be raised to the same level as normal memory cells to obtain an improvement in the reliability of the semiconductor memory device.

In addition, the semiconductor memory device of the present invention may further be provided with a control unit for instructing the capacitor fuse circuit unit to charge the capacitor fuse with the first voltage upon detection of the supply of power, and for instructing the capacitor fuse circuit unit to perform the operations of halting charging of the capacitor fuse, amplifying by means of the sense amplifier, and latching the voltage level that has been amplified when an expansion mode register (EMRS) signal is received as input.

In addition, the semiconductor memory device of the present invention may further be provided with a control unit for: upon detection of supply of the power supply, instructing the capacitor fuse circuit unit to charge the capacitor fuse with the first voltage, and upon receiving a mode register (MRS) signal, instructing the capacitor fuse circuit unit to perform operations of: halting charging of the capacitor fuse, amplifying by means of the sense amplifier, and latching the amplified voltage levels.

Finally, the semiconductor memory device of the present invention may use, as the first voltage, a voltage that is half or less than half the power supply of the sense amplifier.

The above and other objects, features, and advantages of the present invention will become apparent from the following description with reference to the accompanying drawings, which illustrate examples of the present invention.

DETAILED DESCRIPTION OF THE PREFERRED EMBODIMENTS

First Embodiment

Figure 1:
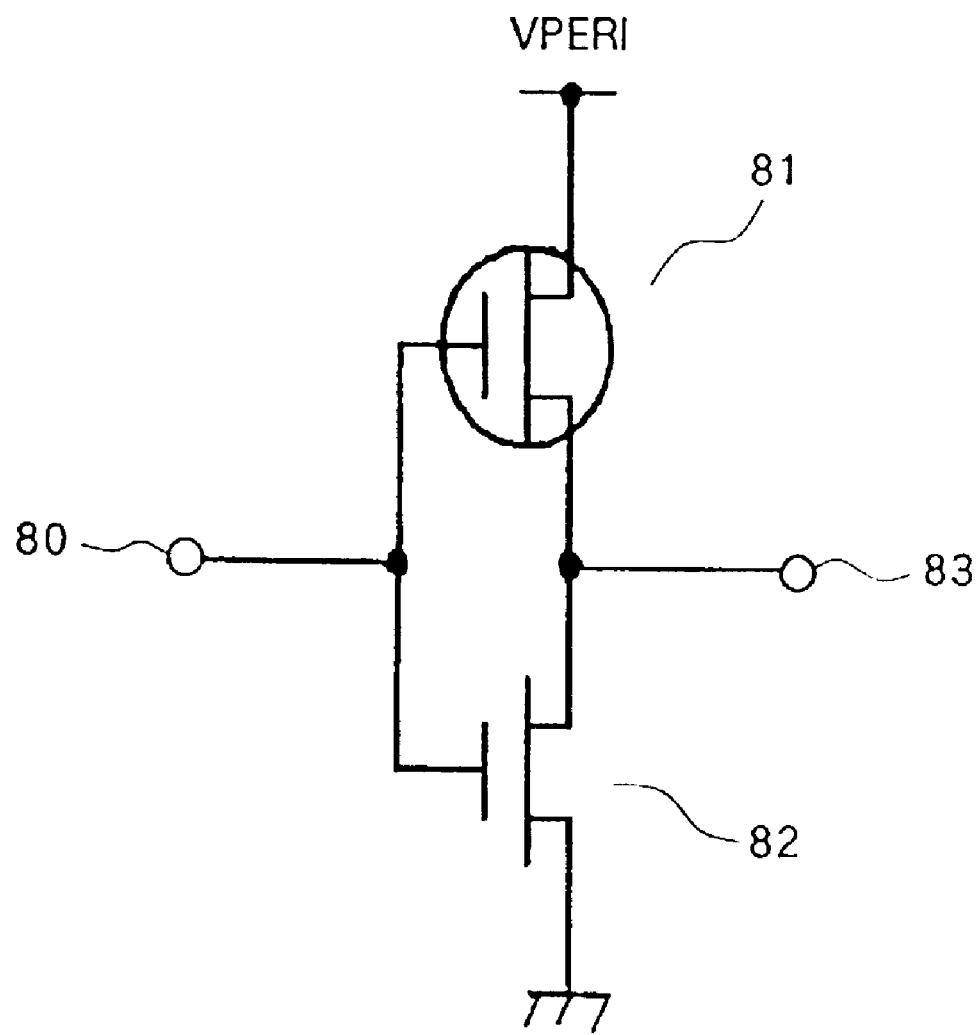
FIG. 1 is a circuit diagram showing an example of an inverter in a latch circuit unit.
Figure 2:
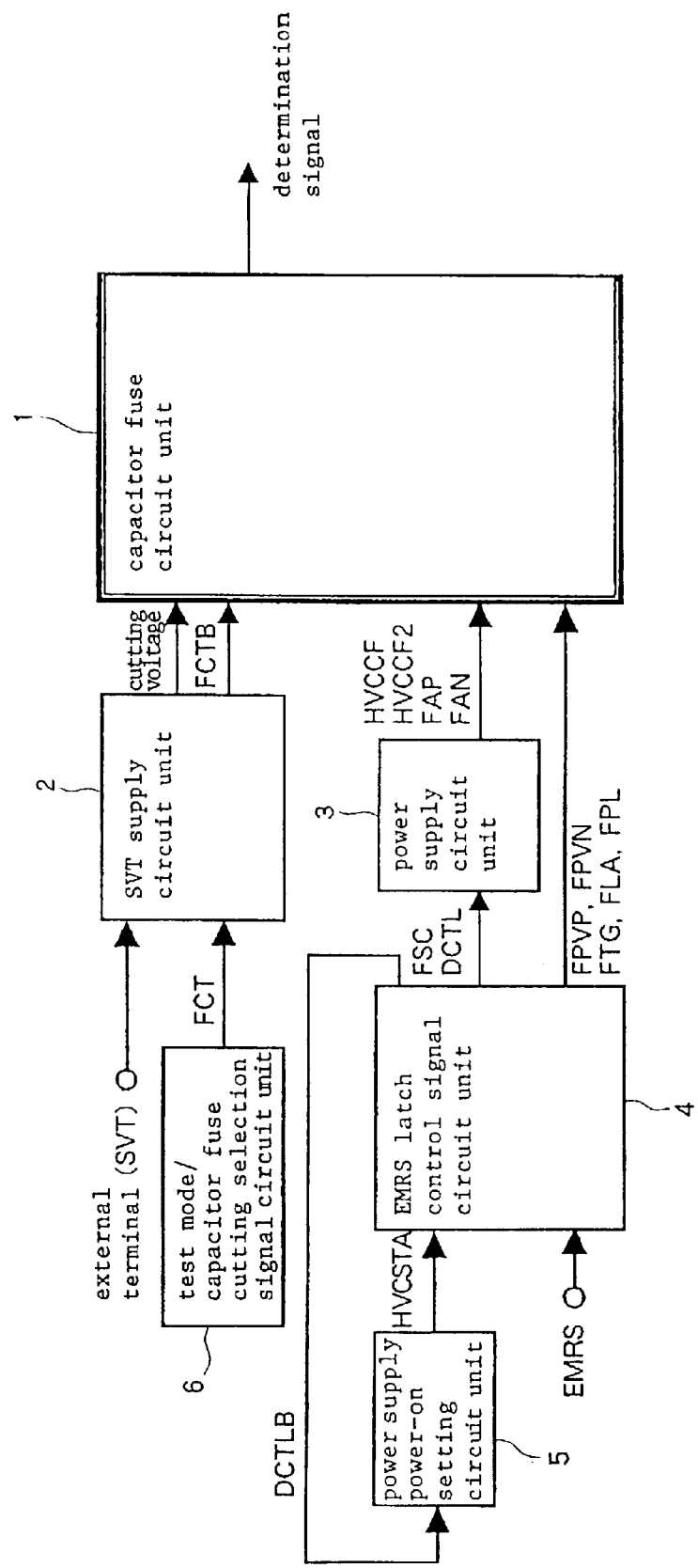
FIG. 2 is a block diagram showing the construction of the circuit portion for cutting and for detecting the occurrence of cutting of a capacitor fuse in the semiconductor memory device of the first embodiment of the present invention.

We first refer to FIG. 2, which is a block diagram showing the construction of a circuit portion for cutting and for detecting the occurrence of cutting of a capacitor fuse in the semiconductor memory device of the first embodiment of the present invention.

As shown in FIG. 2, the semiconductor memory device of this embodiment is provided with: capacitor fuse circuit unit 1, SVT (super voltage) supply circuit unit 2, power supply circuit unit 3, EMRS-latch control signal circuit unit 4, power supply power-on setting circuit unit 5, and test mode/capacitor fuse cutting selection signal circuit unit 6.

Figure 3:
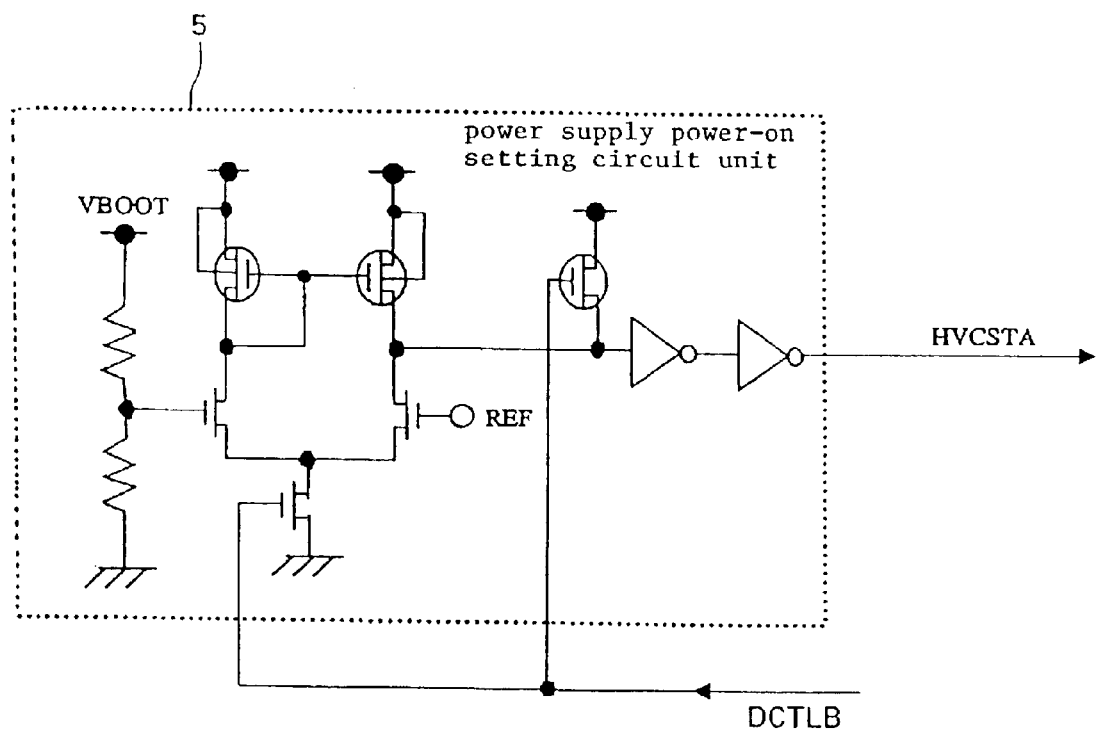
FIG. 3 is a circuit diagram showing an example of the construction of power supply power-on setting circuit 5 in FIG. 2.

Power supply power-on setting circuit unit 5 detects that power is supplied to the semiconductor memory device and makes the HVCSTA signal high level. Power supply power-on setting circuit unit 5 also latches the HVCSTA signal at high level when the DCTLB signal from EMRS latch control signal circuit unit 4 becomes low level. An actual example of the circuit structure of power supply power-on setting circuit unit 5 is shown in FIG. 3. The circuit shown in FIG. 3 operates such that when a voltage that is obtained by resistance-distribution of voltage VBOOT and that changes in unison with the power supply voltage exceeds reference voltage-REF, the HVCSTA signal is made high level.

EMRS-latch control signal circuit unit 4 receives the HVCSTA signal from power supply power-on setting circuit unit 5 and thus detects that power has been supplied to the semiconductor memory device, instructs capacitor fuse circuit unit 1 to start charging the capacitor fuse in capacitor fuse circuit unit 1, and, upon receiving the EMRS (Expansion Mode Register Setting) signal for setting the mode register of the DLL (Double-Locked Loop) circuit that is unique to DDR-SDRAM, instructs the operations of halting the charging of the capacitor fuse, amplifying the voltage that has accumulated in the capacitor fuse, and latching the amplified voltage.

Figure 4:
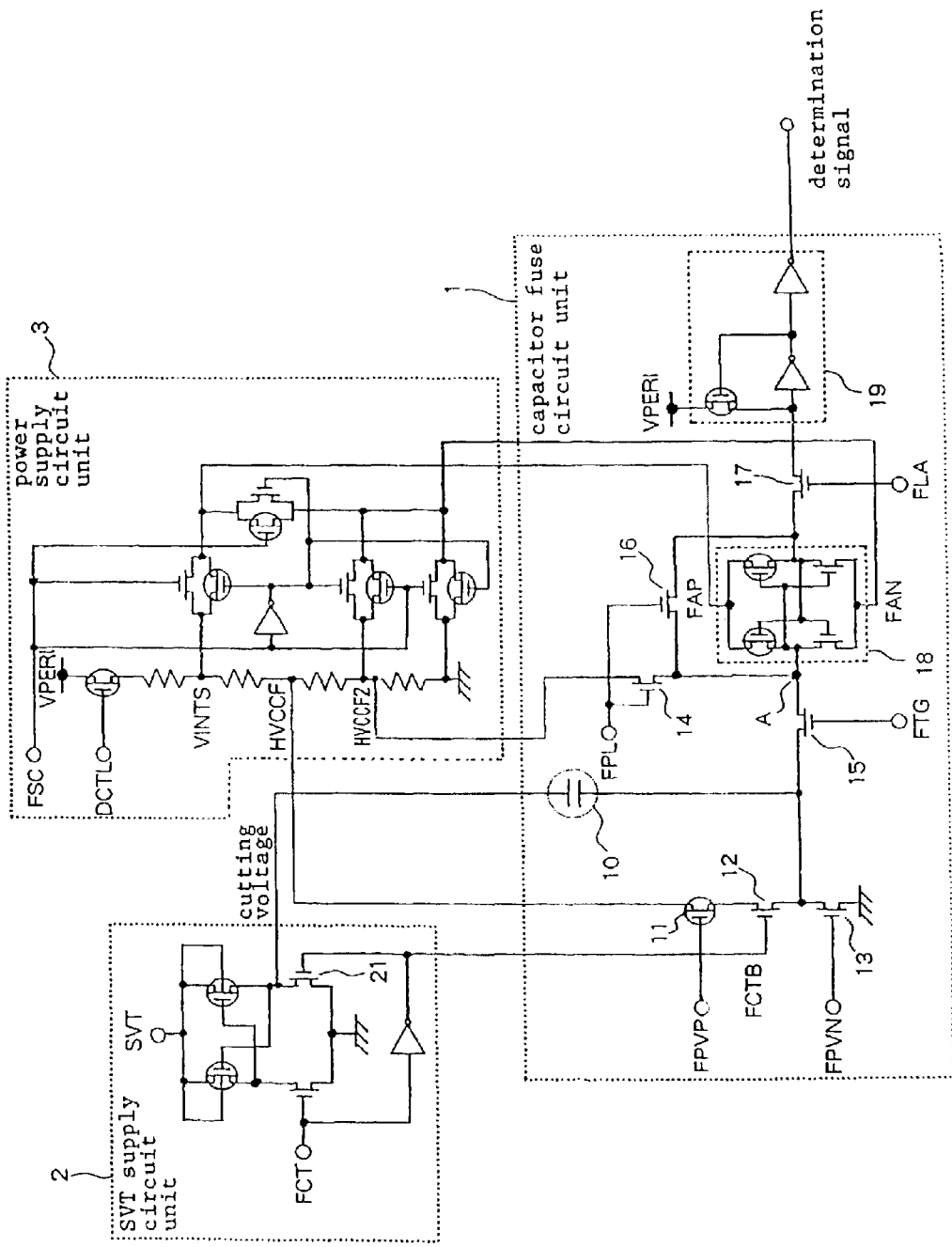
FIG. 4 is a circuit diagram showing an example of the construction of capacitor fuse circuit unit 1, SVT supply circuit unit 2, and power supply circuit unit 3 in FIG. 2.

EMRS-latch control signal circuit unit 4 functions as a control unit for controlling capacitor fuse circuit unit 1, and realizes this control by controlling the FSC signal and DCTL signal to the above-described power supply circuit unit 3 and the FPVP, FPVN, FTG, FLA, and FPL signals to capacitor fuse circuit unit 1. When the capacitor fuse in capacitor fuse circuit unit 1 is to be cut, test mode/capacitor fuse cutting selection signal circuit unit 6 supplies FCT signal as output to SVT supply circuit unit 2. The circuit diagram of FIG. 4 shows an example of the construction of capacitor fuse circuit unit 1, SVT supply circuit unit 2, and power supply circuit unit 3 in FIG. 2.

Power supply circuit unit 3 begins the supply of power when the DCTL signal becomes low level. More specifically, when the DCTL signal becomes low level, power supply circuit unit 3 resistance-distributes voltage VPERI to generate voltages VINTS, HVCCF, and HVCCF2 and of these, supplies voltages HVCCF and HVCCF2 to capacitor fuse circuit unit 1. The relation of these voltages is:

VINTS>HVCCF>HVCCF2

Power supply circuit unit 3 then receives the FSC signal as input from EMRS-latch control signal circuit unit 4, this FSC signal being a signal for controlling the power supply to sense amplifier 18. When this FSC signal is low level, power supply circuit unit 3 supplies voltage HVCCF2 to the power supplies FAP and FAN of sense amplifier 18, and when the FSC signal becomes high level, supplies voltage VINTS to FAP and makes FAN the GND potential.

In the interest of simplifying the following explanation, it is assumed that voltage VPERI is 1.8 V, voltage VINTS is 1.4 V, voltage HVCCF is 0.7 V, and HVCCF2 is a voltage that is slightly lower than voltage HVCCF, e.g. a voltage on the order of 0.5 V. However, the present invention is not limited to these specific voltage values and can be similarly applied using other voltage values.

When the FCT signal from test mode/capacitor fuse cutting selection signal circuit unit 6 becomes high level, SVT supply circuit unit 2 supplies SVT (super voltage), which is a voltage for cutting capacitor fuse 10, as a cutting voltage to capacitor fuse circuit unit 1; but when the FCT signal becomes low level, n-channel MOS transistor 21 turns on, setting the electrode on the high-voltage application side of capacitor fuse 10 to the GND potential. SVT supply circuit unit 2 also supplies the FCTB signal to capacitor fuse circuit unit 1, this FCTB signal being a signal obtained by inverting the logic of the FCT signal.

Capacitor fuse circuit unit 1 is composed of: capacitor fuse 10, p-channel MOS transistor 11, n-channel MOS transistors 12–17, sense amplifier 18, and latch circuit unit 19.

Before the application of SVT and consequent cutting, capacitor fuse 10 is a capacitor composed of two electrodes, these being an electrode on the high-voltage application side to which SVT is applied from SVT supply circuit unit 2 and an electrode on the low-voltage application side to which voltage is applied when checking for the occurrence of cutting.

P-channel MOS transistor 11 receives the FPVP signal as input at its gate, and when this FPVP signal becomes low level, the transistor turns on and applies voltage HVCCF (0.7 V) to n-channel MOS transistor 12. In other words, p-channel MOS transistor 11 functions as a circuit for charging capacitor fuse 10 with voltage HVCCF.

N-channel MOS transistor 12 receives the FCTB signal from SVT supply circuit unit 2 as input at its gate. However, because the FCT signal is low level and the FCTB signal is high level except when cutting the capacitor fuse, n-channel MOS transistor 12 is always ON while determining whether or not cutting of capacitor fuse 10 has occurred.

N-channel MOS transistor 13 receives the FPVN signal at its gate and turns on when this FPVN signal becomes high level, setting the electrode on the low-voltage application side of capacitor fuse 10 to the GND potential.

N-channel MOS transistors 14 and 16 receive the FPL signal at their gates, and each apply voltage HVCCF2 (0.5 V) from power supply circuit unit 3 to a respective one of the two ends of sense amplifier 18 when this FPL signal becomes high level. N-channel MOS transistor 15 receives the FTG signal at its gate and turns on when this FTG signal becomes high level to send the voltage level of the electrode on the low-voltage application side of capacitor fuse 10 to sense amplifier 18.

Sense amplifier 18 is of the same circuit composition as a normal sense amplifier for amplifying the minute potential difference that is read from memory cells, and amplifies the difference in potential between voltage HVCCF2 that is supplied from power supply circuit unit 3 by way of n-channel MOS transistor 18 and the voltage of node A that is transferred from n-channel MOS transistor 15.

N-channel MOS transistor 17 receives the FLA signal at its gate and transfers the voltage that has been amplified by sense amplifier 18 to latch circuit unit 19 when this FLA signal becomes high level. Latch circuit unit 19 latches the voltage level of sense amplifier 18 that has been transferred by n-channel MOS transistor 17 and supplies this signal as a determination signal.

Figure 5:
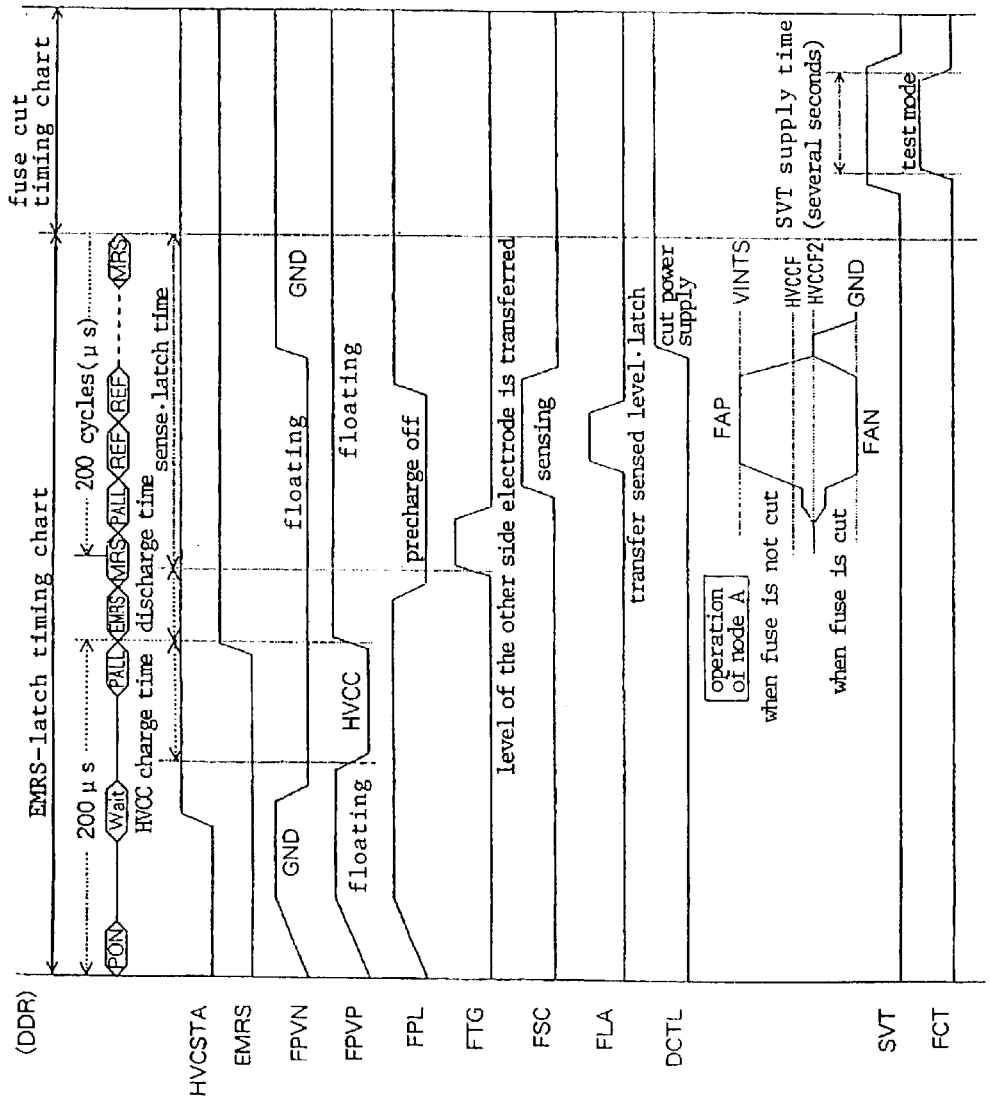
FIG. 5 is a timing chart showing the operation of the semiconductor memory device of the first embodiment of the present invention.

We next refer to the timing chart of FIG. 5 to explain the details regarding the operation of the semiconductor memory device of the present embodiment.

Power supply power-on setting circuit unit 5 first detects that power has been supplied to the semiconductor memory device and makes the HVCSTA signal high level, whereupon EMRS-latch control signal circuit unit 4 makes the FPVN and FPVP signals low level. As a result, p-channel MOS transistor 11 turns on and n-channel MOS transistor 13 turns off in capacitor fuse circuit unit 1. Since the DCTL signal is low level at this point, voltages HVCCF (0.7 V) and HVCCF2 (0.5 V) are generated in power supply circuit unit 3 and supplied to capacitor fuse circuit unit 1. Further, the FCTB signal from SVT supply circuit unit 2 becomes high level, whereby n-channel MOS transistor 12 in capacitor fuse circuit unit 1 turns on. The voltage HVCCF (0.7 V) from power supply circuit unit 3 is therefore applied to the electrode on the low-voltage application side of capacitor fuse 10 by way of p-channel MOS transistor 11 and n-channel MOS transistor 12. Since the FCTB signal in SVT supply circuit unit 2 is high level at this time, n-channel MOS transistor 21 turns on and the electrode on the high-voltage application side of capacitor fuse 10 is connected to the GND potential. The performance of the above-described operations results in charging of capacitor fuse 10 by voltage HVCCF (0.7 V).

Parallel with this charging of capacitor fuse 10 by HVCCF, the low level of the FSC signal from EMRS-latch control signal circuit unit 4 causes voltage HVCCF2 (0.5 V) in power supply circuit unit 3 to be supplied to the power supplies FAP and FAN of sense amplifier 18. Further, the high level of the FPL signal from EMRS-latch control signal circuit unit 4 causes n-channel MOS transistors 14 and 16 in capacitor fuse circuit unit 1 to both turn on, whereby voltage HVCCF2 (0.5 V) is applied to the two ends of sense amplifier 18.

In the timing chart of FIG. 5, a case is described in which the standby time from the time power is turned on until voltage HVCCF is charged to capacitor fuse 10 is 200 $\mu$s, but this specification may also be 100 $\mu$s.

After the passage of the time interval for charging capacitor fuse 10 with HVCCF, EMRS-latch control signal circuit unit 4 receives the EMRS signal as input, whereby an operation starts for discharging the voltage that has accumulated in capacitor fuse 10. More specifically, EMRS-latch control signal circuit unit 4 makes the FPVP signal high level whereby p-channel MOS transistor 11 of capacitor fuse circuit unit 1 turns off. As a result, voltage HVCCF (0.7 V) from power supply circuit unit 3 is cut off, and if capacitor fuse 10 has been cut, the voltage of the electrode on the low-voltage application side is discharged by way of n-channel MOS transistor 21 of SVT supply circuit unit 2. If capacitor fuse 10 has not been cut, the voltage of the electrode on the low-voltage application side is maintained unchanged at HVCCF (0.7 V).

After completion of the time interval for discharging, the FTG signal from EMRS-latch control signal circuit unit 4 becomes high level, and the voltage level of the electrode on the low-voltage application side of capacitor fuse 10 is thus transferred to the terminal on the node-A side of sense amplifier 18. At this time, the FSC signal from EMRS-latch control signal circuit unit 4 changes to high level, and this change causes power supply circuit unit 3 to supply voltage VINTS (1.4 V) to FAP of sense amplifier 18 and make FAN the GND potential. Sense amplifier 18 therefore begins operation and amplifies the difference in potential between the voltage of the terminal on the node-A side and HVCCF2 (0.5 V), this voltage being the voltage on the side opposite node A.

If the capacitor fuse is not cut, the voltage of node A will be HVCCF (0.7 V), and the relation HVCCF>HVCCF2 causes the voltage of node A to be amplified to VINTS (1.4 V), which is the power supply voltage of sense amplifier 18. The voltage of the terminal opposite node A will be GND potential. On the other hand, if the capacitor fuse has been cut, the voltage of node A will be substantially the GND potential, whereby the relation GND<HVCCF2 causes the voltage of node A to become GND potential. The voltage on the terminal opposite node A is then amplified to VINTS (1.4 V), which is the power supply voltage of sense amplifier 18 several.

The FLA signal from EMRS-latch control signal circuit unit 4 then becomes high level, whereby n-channel MOS transistor 17 turns on and the voltage that has been amplified by sense amplifier 18 is transferred to latch circuit unit 19. The voltage from n-channel MOS transistor 17 is latched by latch circuit unit 19 and then supplied as a determination signal.

Implementing the above-described control enables detection of whether capacitor fuse 10 has been cut or not and generates a determination signal based on the detection result. Explanation next concerns the operation when cutting capacitor fuse 10.

When capacitor fuse 10 is to be cut, the FCT signal from test mode/capacitor fuse cutting selection signal circuit unit 6 is changed to high level, and this change causes SVT supply circuit unit 2 to change the FCTB signal to capacitor fuse circuit unit 1 to low level and thus turn OFF n-channel MOS transistor 12. The cutting voltage is then applied from SVT supply circuit unit 2 to the electrode on the high-voltage application side of capacitor fuse 10. This SVT voltage is typically applied for a time interval of several seconds. Capacitor fuse 10 thus experiences a dielectric breakdown, its two electrodes become electrically connected, and the fuse becomes equivalent to a resistor element.

When detecting the occurrence of cutting of capacitor fuse in the semiconductor memory device of the present embodiment, voltage HVCCF (0.7 V), which is half of voltage VINTS (1.4 V) for driving sense amplifier 18, is charged to capacitor fuse 10; the difference in potential between the voltage that accumulates in capacitor fuse 10 and voltage HVCCF2 (0.5 V) is amplified by means of sense amplifier 18; and the amplified potential difference is then latched by latch circuit unit 19 and supplied as a determination signal. Even if the voltage that is stored in capacitor fuse 10 is 0.7 V, the amplification of this voltage to 1.4 V by sense amplifier 18 allows the latching operation to be carried out without difficulty by latch circuit unit 19. In addition, when detecting the occurrence of cutting of capacitor fuse 10, no more than voltage HVCFF (0.7 V), which is a voltage equivalent to the voltage that is normally applied to memory cells, is applied across the two electrodes of capacitor fuse 10. The life expectancy of capacitor fuse 10 can therefore be raised to the same level as normal memory cells and the reliability of the semiconductor memory device consequently improved.

In addition, all of the operations such as discharging and latching may be carried out from EMRS signals without using power supply power-on setting circuit unit 5.

Second Embodiment

Explanation next regards the semiconductor memory device of the second embodiment of the present invention. In the above-described first embodiment, the present invention was applied to a semiconductor memory device of the DDR mode, but in the present embodiment, the present embodiment is applied to a semiconductor memory device of the SDR mode. The construction of the circuit portion for cutting and for detecting whether or not a capacitor fuse has been cut in a semiconductor memory device of the present embodiment is similar to the construction of the semiconductor memory device of the first embodiment shown in FIG. 2. However, because there are no DLL circuits in the SDR mode, there is no EMRS signal. The present embodiment therefore differs in that EMRS-latch control signal circuit unit 4 takes an MRS signal as a reference instead of an EMRS signal when starting the discharging operation of the capacitor fuse.

In addition, the power supply capacity of power supply circuit unit 3 need not be great in the case of the DDR mode because the time interval from the input of an EMRS signal until the start of normal operation is as long as 200 cycles (200×5 nS=1 $\mu$s). As a result, a circuit can be adopted in which each of the various voltages such as voltage VINTS, HVCCF, and HVCCF2 are generated by means of resistor-distribution as shown in FIG. 4. In the case of the SDR mode, however, the time interval from the input of an MRS signal until the start of normal operation is extremely short at 2 cycles (2×5 nS=10 nS). The processes such as the discharging of voltage from the capacitor fuse must therefore be carried out within a short time interval, and a power supply circuit unit is required that has a greater power supply capacity than in the DDR mode.

Figure 6:
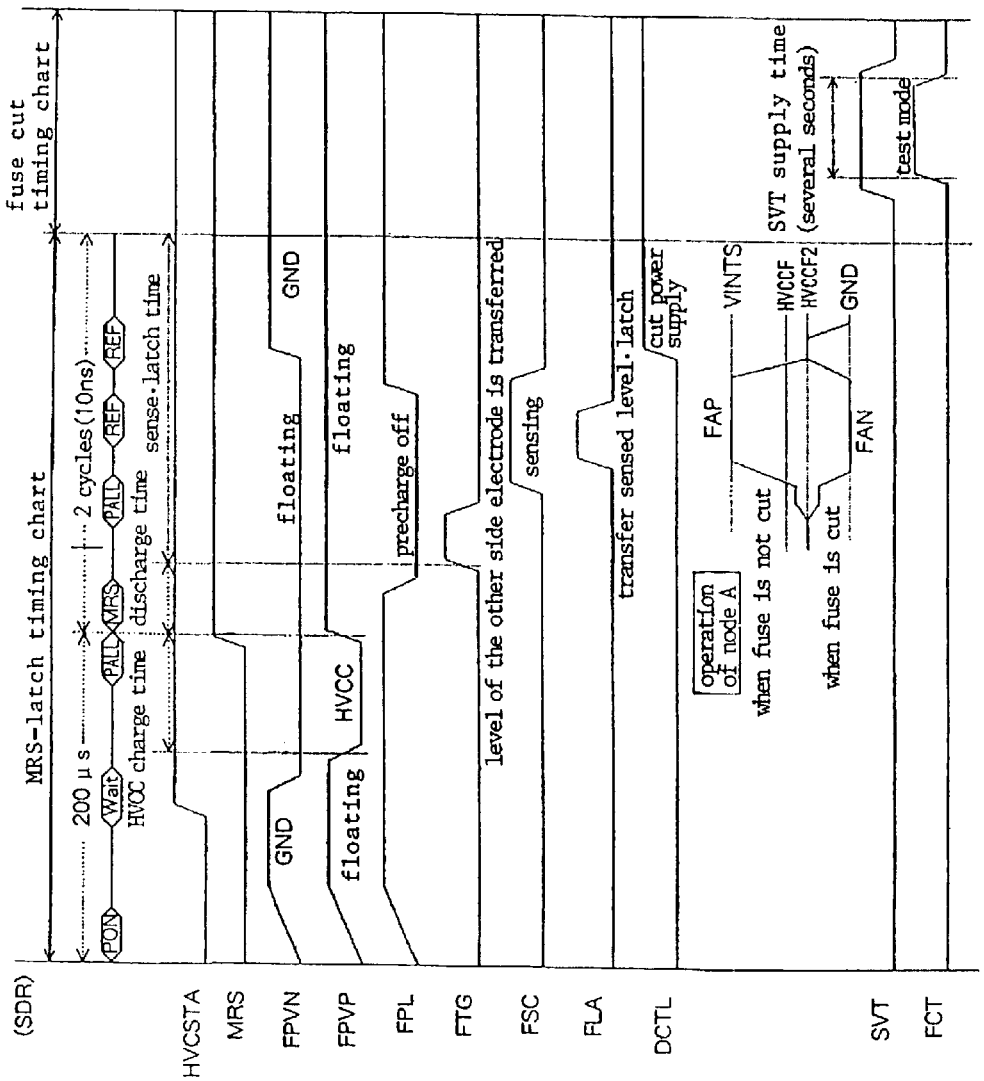
FIG. 6 is a timing chart showing the operation of the semiconductor memory device of the second embodiment of the present invention.

We next refer to the timing chart of FIG. 6 to explain the operations in the semiconductor memory device of this embodiment. The basic operation in the semiconductor memory device of the present embodiment is similar to that of the timing chart shown in FIG. 5, and differs only in that the discharging operation is started by an MRS signal instead of being started by an EMRS signal.

A case was described in the semiconductor memory device of the above-described first and second embodiments in which the voltage that was applied to capacitor fuse 10 when detecting whether capacitor fuse 10 has been cut or not was HVCCF, which is one half of the power supply voltage VINTS of sense amplifier 18, but the present invention is not limited to this form and can also be similarly applied to a case in which a voltage of HVCCF or less is applied to capacitor fuse 10.

Typically, a sense amplifier can amplify even a minute potential difference. Thus, by preparing the voltage that is applied to the capacitor fuse and a voltage that is slightly lower than this voltage, the method of checking the state of a capacitor fuse according to the present embodiment enables a further reduction of the voltage that is applied to a capacitor fuse when detecting whether the capacitor fuse has been cut or not.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device, comprising
   a power supply generation circuit unit for generating a first voltage and a second voltage that is lower than said first voltage; and
   a capacitor fuse circuit unit composed of a capacitor fuse, a circuit for charging said capacitor fuse with said first voltage, a sense amplifier for amplifying the difference in potential between voltage that has accumulated in said capacitor fuse and said second voltage, and a latch circuit unit for latching the voltage level that has been amplified by said sense amplifier and supplying the result as a determination signal.

2. A semiconductor memory device according to claim 1, further comprising a control unit for:
   upon detecting the supply of power, instructing said capacitor fuse circuit unit to charge said capacitor fuse with said first voltage, and
   upon receiving an expansion mode register (EMRS) signal as input, instructing said capacitor fuse circuit unit to perform operations of halting charging of said capacitor fuse, amplifying by means of the sense amplifier, and latching voltage levels that have been amplified.

3. A semiconductor memory device according to claim 2, wherein said first voltage is half or less than half the power supply for said sense amplifier.

4. A semiconductor memory device according to claim 1, further comprising a control unit for:
   upon detecting the supply of power, instructing said capacitor fuse circuit unit to charge said capacitor fuse with said first voltage; and
   upon receiving a mode register (MRS) signal, instructing said capacitor fuse circuit unit to perform operations of:
      halting charging of said capacitor fuse, amplifying by means of said sense amplifier, and latching the amplified voltage levels.

5. A semiconductor memory device according to claim 4, wherein said first voltage is half or less than half the power supply for said sense amplifier.

6. A semiconductor memory device according to claim 1, wherein said first voltage is half or less than half the power supply for said sense amplifier.

7. A method of checking the state of a capacitor fuse for detecting the occurrence of cutting of a capacitor fuse that is provided in a semiconductor memory device, said method comprising the steps of:
   charging a capacitor fuse with a first voltage;
   after the passage of a fixed time interval from halting charging of said first voltage, using a sense amplifier to amplify the difference in potential between voltage that has accumulated in said capacitor fuse and a second voltage that is lower than said first voltage; and
   latching the level of the voltage that has been amplified by said sense amplifier and supplying the result as a determination signal.

8. A method of checking the state of a capacitor fuse according to claim 7, wherein:
   said step of charging said capacitor fuse with said first voltage
   is a step for charging said capacitor fuse with said first voltage that is activated by detecting the supply of power.

9. A method of checking the state of a capacitor fuse according to claim 8, wherein said first voltage is half or less than half the power supply for said sense amplifier.

10. A method of checking the state of a capacitor fuse according to claim 7, wherein:
    said step of using a sense amplifier to amplify the difference in potential between voltage that has accumulated in said capacitor fuse and a second voltage that is lower than said first voltage after the passage of a fixed time interval from halting charging of said first voltage
    further comprises a step of halting charging of said capacitor fuse with said first voltage, this step being activated by receiving an expansion mode register (EMRS) signal.

11. A method of checking the state of a capacitor fuse according to claim 10, wherein said first voltage is half or less than half the power supply for said sense amplifier.

12. A method of checking the state of a capacitor fuse according to claim 7, wherein:
    said step of using a sense amplifier to amplify the difference in potential between voltage that has accumulated in said capacitor fuse and a second voltage that is lower than said first voltage after the passage of a fixed time interval from halting charging of said first voltage
    further comprises a step of halting charging of said capacitor fuse with said first voltage, this step being activated by receiving a mode register (MRS) signal.

13. A method of checking the state of a capacitor fuse according to claim 12, wherein said first voltage is half or less than half the power supply for said sense amplifier.

14. A method of checking the state of a capacitor fuse according to claim 7, wherein said first voltage is half or less than half the power supply for said sense amplifier.

* * * * *